US011063112B2

(12) United States Patent
Zhang (10) Patent No.: US 11,063,112 B2
(45) Date of Patent: Jul. 13, 2021

(54) DRAM INTERCONNECT STRUCTURE HAVING FERROELECTRIC CAPACITORS EXHIBITING NEGATIVE CAPACITANCE

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

(*) Notice: Subject to any disclaimer, the term of this patent is extended or adjusted under 35 U.S.C. 154(b) by 7 days.

(21) Appl. No.: 16/164,481

(22) Filed: Oct. 18, 2018

(65) Prior Publication Data

US 2019/0051722 A1     Feb. 14, 2019

Related U.S. Application Data

(62) Division of application No. 14/266,384, filed on Apr. 30, 2014, now Pat. No. 10,128,327.

(51) Int. Cl.
*H01L 27/108*     (2006.01)
*H01L 21/02*     (2006.01)
(Continued)

(52) U.S. Cl.
CPC ........ *H01L 28/56* (2013.01); *H01L 21/02197* (2013.01); *H01L 27/108* (2013.01);
(Continued)

(58) Field of Classification Search
None
See application file for complete search history.

(56) References Cited

U.S. PATENT DOCUMENTS 5,903,492 A * 5/1999 Takashima .............. G11C 11/22
257/E27.104
6,734,484 B2    5/2004 Wu
(Continued)

FOREIGN PATENT DOCUMENTS

CN     105609503 A     5/2016

OTHER PUBLICATIONS

Then et al., "Experimental Observation and Physics of "Negative" Capacitance and Steeper than 40mV/decade Subthreshold Swing in Al0.83In0.17N/AlN/GaN MOS-HEMT on SiC Substrate", Electron Devices Meeting (IEDM), 2013 IEEE International, Dec. 9-11, 2013, pp. 28.3.1-28.3.4.
(Continued)

*Primary Examiner* — Erik Kielin
(74) *Attorney, Agent, or Firm* — Seed IP Law Group LLP (57) ABSTRACT

An interconnect structure for use in coupling transistors in an integrated circuit is disclosed, including various configurations in which ferroelectric capacitors exhibiting negative capacitance are coupled in series with dielectric capacitors. In one embodiment, the negative capacitor includes a dielectric/ferroelectric bi-layer. When a negative capacitor is electrically coupled in series with a conventional dielectric capacitor, the series combination behaves like a stable ferroelectric capacitor for which the overall capacitance can be measured experimentally, and tuned to a desired value. The composite capacitance of a dielectric capacitor and a ferroelectric capacitor having negative capacitance coupled in series is, in theory, infinite, and in practice, very large. A series combination of positive and negative capacitors within a microelectronic interconnect structure can be used to make high capacity DRAM memory cells.

16 Claims, 10 Drawing Sheets

(51) Int. Cl.
H01L 21/28 (2006.01)
H01L 49/02 (2006.01)
H01L 27/11507 (2017.01)

(52) U.S. Cl.
CPC .. H01L 27/10805 (2013.01); H01L 27/10844 (2013.01); H01L 27/11507 (2013.01); H01L 28/55 (2013.01); H01L 28/60 (2013.01); H01L 28/65 (2013.01); H01L 29/40111 (2019.08)

(56) References Cited

U.S. PATENT DOCUMENTS

| | | | |
|---|---|---|---|
| 7,824,982 | B2 | 11/2010 | Forbes |
| 2002/0075736 | A1* | 6/2002 | Kumura ............ H01L 27/11507 365/200 |
| 2003/0107072 | A1 | 6/2003 | Fujimori |
| 2004/0113190 | A1* | 6/2004 | Oh ........................ H01L 28/60 257/296 |
| 2004/0121566 | A1 | 6/2004 | Laibowitz et al. |
| 2004/0232457 | A1* | 11/2004 | Wohlfahrt ......... H01L 27/11502 257/295 |
| 2009/0040808 | A1* | 2/2009 | Krieger ............. H01L 29/40111 365/145 |
| 2009/0175066 | A1 | 7/2009 | Kim |
| 2010/0038752 | A1 | 2/2010 | Ng et al. |
| 2012/0033478 | A1* | 2/2012 | Kang ................ H01L 29/40111 365/145 |
| 2015/0117084 | A1 | 4/2015 | Karda et al. |

OTHER PUBLICATIONS

Salahuddin et al., "Use of Negative Capacitance to Provide Voltage Amplification for Low Power Nanoscale Devices", School of Electrical and Computer Engineering and NSF Center for Computational Nanotechnology (NCN), Nano Letters, 2008, vol. 8, No. 2, pp. 405-410.

Hwang, Cheol Seong, "Semiconductor memory technology it is time to shift the paradigm", Dielectric Thin Film Lab, Seoul National University, 2013 MRS Spring Meeting & Exhibit, Apr. 2013, 40 pages.

Khan, Asif et al. "Ferroelectric Negative Capacitance MOSFET: Capacitance Tuning and Antiferroelectric Operation", Proceeding of the Electron Devices Meeting (IEDM), 2011 IEEE International, Dec. 5-7, 2011, pp. 11.3.1-11.3.4.

Alexander Ruso, et al., "Metal-Ferroelectric-Metal-Oxide-Semiconductor Field Effect Transistor with Sub-60mV/decade Sub-threshold Swing and Internal Voltage Amplification" Proceeding of the Electron Devices Meeting (IEDM), 2010 IEEE International, Dec. 6-8, 2010, pp. 16.3.1-16.3.4.

Khan, Asif, et al. "Experimental evidence of ferroelectric negative capacitance in nanoscale heterostructures" Applied Physics Letters 99, 113501 (2011).

R. A. McKee, et al., "Crystalline Oxides on Silicon: The First Five Monolayers" in Physical Review Letters vol. 81, No. 14, Oct. 5, 1998, pp. 3014-3017.

Bangsaruntip et al., "Density scaling with gate-all-around silicon nanowire MOSFETs for the 10 nm node and beyond," 2013 IEEE International Electron Devices Meeting, Washington, DC, Dec. 9-11, 2013, 4 pages.

Chandrasekaran, "Challenges in 3D Memory Manufacturing and Process Integration," 2013 IEEE International Electron Devices Meeting, Washington, DC, Dec. 9-11, 2013, 5 pages.

Cheng et al., "Atomic-level Engineering of Phase Change Material for Novel Fast-switching and High-endurance PCM for Storage Class Memory Application," 2013 IEEE International Electron Devices Meeting, Washington, DC, Dec. 9-11, 2013, 4 pages.

Duriez et al., "Scaled p-channel Ge FinFET with optimized gate stack and record performance integrated on 300mm Si wafers," 2013 IEEE International Electron Devices Meeting, Washington, DC, Dec. 9-11, 2013, 4 pages.

Gupta et al., "A Group IV Solution for 7 nm FinFET CMOS: Stress Engineering Using Si, Ge and Sn," 2013 IEEE International Electron Devices Meeting, Washington, DC, Dec. 9-11, 2013, 4 pages.

Hsieh et al., "Ultra High Density 3D Via RRAM in Pure 28nm CMOS Process," 2013 IEEE International Electron Devices Meeting, Washington, DC, Dec. 9-11, 2013, 4 pages.

Hsu et al., "3D Vertical $TaO_x/TiO_2$ RRAM with over $10^3$ Self-Rectifying Ration and Sub-μA Operating Current," 2013 IEEE International Electron Devices Meeting, Washington, DC, Dec. 9-11, 2013, 4 pages.

Jameson et al., "Conductive-bridge memory (CBRAM) with excellent high-temperature retention," 2013 IEEE International Electron Devices Meeting, Washington, DC, Dec. 9-11, 2013, 4 pages.

Kim et al., "A Phase Change Memory Cell with Metallic Surfactant Layer as a Resistance Drift Stabilizer," 2013 IEEE International Electron Devices Meeting, Washington, DC, Dec. 9-11, 2013, 4 pages.

Lee et al., "Oxygen Potential Engineering of Interfacial Layer for Deep Sub-nm EOT High-κ Gate Stacks on Ge," 2013 IEEE International Electron Devices Meeting, Washington, DC, Dec. 9-11, 2013, 4 pages.

Lue et al., "A Novel Dual-Channel 3D NAND Flash Featuring both N-Channel and P-Channel NAND Characteristics for Bit-alterable Flash Memory and a New Opportunity in Sensing the Stored Charge in the WL Space," 2013 IEEE International Electron Devices Meeting, Washington, DC, Dec. 9-11, 2013, 4 pages.

Matsuda et al., "Superior Cu Fill with Highly Reliable Cu/ULK Integration for 10nm Node and Beyond," 2013 IEEE International Electron Devices Meeting, Washington, DC, Dec. 9-11, 2013, 4 pages.

Mizubayashi et al., "Heated Ion Implantation Technology for Highly Reliable Metal-gate/High-k CMOS SOI FinFETs," 2013 IEEE International Electron Devices Meeting, Washington, DC, Dec. 9-11, 2013, 4 pages.

Müller et al., "Ferroelectric Hafnium Oxide: A CMOS-compatible and highly scalable approach to future ferroelectric memories," 2013 IEEE International Electron Devices Meeting, Washington, DC, Dec. 9-11, 2013, 4 pages.

Sato et al., "Comprehensive study of CoFeB—MgO magnetic tunnel junction characteristics with. single- and double-interface scaling down to 1X nm," 2013 IEEE International Electron Devices Meeting, Washington, DC, Dec. 9-11, 2013, 4 pages.

Seo et al., "Highly Reliable MIX MLC NAND Flash Memory Cell with Novel Active Air-gap and p+ Poly Process Integration Technologies," 2013 IEEE International Electron Devices Meeting, Washington, DC, Dec. 9-11, 2013, 4 pages.

Wang et al., "Retention Time Optimization for eDRAM in 22 nm Tri-Gate CMOS Technology," 2013 IEEE International Electron Devices Meeting, Washington, DC, Dec. 9-11, 2013, 4 pages.

Witters et al., "Strained Germanium Quantum Well pMOS FinFETs Fabricated on in situ Phosphorus-Doped SiGe Strain Relaxed Buffer Layers Using a Replacement Fin Process," 2013 IEEE International Electron Devices Meeting, Washington, DC, Dec. 9-11, 2013, 4 pages.

Wu et al., "A 16nm FinFET CMOS Technology for Mobile SoC and Computing Applications," 2013 IEEE International Electron Devices Meeting, Washington, DC, Dec. 9-11, 2013, 4 pages.

Yuasa et al., "Future Prospects of MRAM Technologies," 2013 IEEE International Electron Devices Meeting, Washington, DC, Dec. 9-11, 2013, 4 pages.

Lane et al., "Environmental Effects on Cracking and Delamination of Dielectric Films," *IEEE Transactions on Device and Materials Reliability* 4(2):142-147, 2004.

Liniger et al., "Moisture-driven crack growth in blanket low dielectric constant and ultralow dielectric constant films," *Journal of Applied Physics* 96(6):3482-3485, 2004 (6 pages).

* cited by examiner

DRAM INTERCONNECT STRUCTURE HAVING FERROELECTRIC CAPACITORS EXHIBITING NEGATIVE CAPACITANCE

BACKGROUND

Technical Field

The present disclosure generally relates to high speed integrated circuits, and in particular, to the use of ferroelectric capacitors to improve performance of DRAM memory cells.

Description of the Related Art

Transistor devices are coupled together by multi-layer metal interconnect structures to form integrated circuits (ICs) such as logic devices, or processors, and random access memory arrays such as static RAM (SRAM), dynamic RAM (DRAM), and flash memory. As the dimensions of integrated circuit elements continue to shrink below 20 nm, integration of new materials within the interconnect structures becomes more challenging. Materials used to form the interconnect structure at the 20 nm technology node include various metals and ultra-low-k (ULK) dielectrics that provide insulation between stacked metal layers, and between adjacent metal lines. To achieve fast device operation, it is important that vertical capacitances between the metal layers and horizontal capacitances between the metal lines are minimized. While it is desirable to reduce the vertical capacitances as much as possible by using ULK dielectrics, such materials tend to be porous and lack structural integrity, as is described in U.S. patent application Ser. Nos. 14/098,286 and 14/098,346 to the same inventor as the inventor of this patent application. While device speeds benefit from small capacitances, DRAMs and other high speed, high density memories under development require larger capacitances for increased storage capacity, and low power operation. Thus a conflict arises, for memory ICs in particular, between the need for higher speed and larger storage capacity.

As is well known in the art, conventional dielectric capacitors include two conducting plates separated by a dielectric material such as, for example, silicon dioxide ($SiO_2$). When a voltage is applied across the plates, dipole moments within the dielectric material align to produce an internal polarization P that opposes the electric field E associated with the applied voltage, thus allowing positive charge to remain on one metal plate and negative charge to remain on the other conducting plate, as stored charge. The amount of charge stored on the plates is proportional to the applied voltage, according to the linear relationship $Q=CV$. The constant of proportionality, C, is known as capacitance, which is a positive value. A conventional capacitor has a fixed capacitance that is independent of the circuit in which it is used. Furthermore, the relationship between the polarization P and the applied electric field E is also linear.

There also exist ferroelectric capacitors in which a ferroelectric material is substituted for the dielectric material between the conducting plates. Behavior of ferroelectric capacitors for use in nanoscale devices is described by Salahuddin and Datta (*Nano Letters*, Vol. 8, No. 2, pp. 405-410). At certain temperatures, ferroelectric materials exhibit spontaneous polarization P that can be reversed by applying an electric field. Materials that have ferroelectric properties at, or close to, room temperature include, for example, barium titanate ($BaTiO_3$), lead titanate ($PbTiO_3$), and lead zirconate titanate (PZT). In analogy with ferromagnetic materials, the relationship between the polarization P and the applied electric field E of a ferroelectric capacitor exhibits hysteresis and is therefore non-linear. Furthermore, there can be a region of the associated hysteresis curve in which the slope $dP/dE$ is negative and the capacitor is unstable. Normally, the induced polarization opposes the applied electric field. However, during an intermittent time interval during which the slope of the hysteresis curve is negative, the induced polarization enhances the applied field, thus creating positive feedback.

Because the ferroelectric material is already polarized before a voltage is even applied, the charge stored in the ferroelectric capacitor is not zero when $V=0$. Instead, the relationship between the stored charge and the capacitance is given by $$Q=C_o(V+\alpha Q). \tag{1}$$

In Equation (1) $\alpha Q$ is a feedback voltage that is proportional to the charge Q on the capacitor, wherein $\alpha$ is a constant of proportionality. The effective capacitance $C_{eff}$ that satisfies the relationship $Q=C_{eff}V$ is then given by $C_{eff}=C_o/(1-\alpha C_o)$, which theoretically can be a negative number when $\alpha C_o>1$. Negative values of $C_{eff}$ are associated with the unstable region of the hysteresis curve and are unlikely to be observed experimentally.

BRIEF SUMMARY

When a ferroelectric capacitor having a negative effective capacitance is electrically coupled in series with a conventional dielectric capacitor, the series combination behaves like a stable ferroelectric capacitor. In other words, the series configuration has a stabilizing effect on the negative capacitor, such that the overall capacitance can be measured experimentally, and tuned to a desired value. It is well known that connecting two identical conventional dielectric capacitors in series lowers the overall capacitance by half:

$$C_{tot}=[1/C_1+1/C_1]^{-1}=C_1/2. \tag{2}$$

Thus, by forming positive capacitors in series within a transistor interconnect structure, the need for reduced interconnect capacitance is satisfied. Applying equation (2) to determine the overall, or composite, capacitance of a dielectric capacitor $C_1$ and a ferroelectric capacitor $-C_1$ coupled in series yields $$C_{tot}=[1/C_1+1/(-C_1)]^{-1}=0^{-1}=\infty. \tag{3}$$

While an infinite capacitance is not realistic, equation (3) predicts a very large value for a series combination of positive and negative capacitors. Thus, by forming positive and negative capacitors in series within the interconnect structure, high capacity DRAM memory cells are also provided.

Based on these predictions, an interconnect structure for use in coupling transistors in an integrated circuit is presented herein, including various configurations in which ferroelectric capacitors exhibiting negative capacitance are coupled in series with dielectric capacitors. In one embodiment, the ferroelectric capacitors include a dielectric/ferroelectric bi-layer.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to ferroelectric capacitors that have been produced; however, the present disclosure and the reference to certain materials, dimensions, and the details and ordering of processing steps are exemplary and should not be limited to those shown.

Figure 1A:
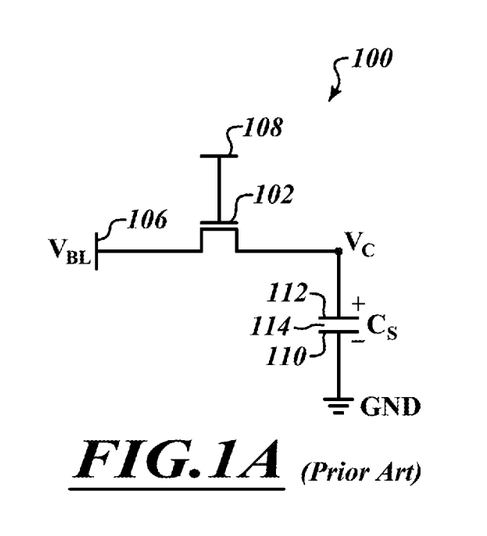
FIG. 1A is a circuit schematic of a conventional dynamic random access memory (DRAM) cell, according to the prior art.

FIG. 1A shows a conventional dynamic random access memory (DRAM) cell 100, which is well known in the art. The DRAM cell 100 includes a transistor 102 and a storage capacitor $C_s$. Multiple DRAM cells 100 are typically arranged in a two-dimensional memory array such that each DRAM cell can be addressed by specifying a bit line 106 (column) and a word line 108 (row) of the array. To read the DRAM cell 100, the bit line 106 can be brought to a voltage that is half of the voltage stored as a logic 1 on a capacitor. The transistor 102 is then turned on by energizing the word line 108, causing current to flow between the storage capacitor $C_s$ and the bit line 106. If the storage capacitor contains a logic 1, the voltage $V_c$ exceeds the bit line voltage $V_{BL}$, and thus current flows from the storage capacitor to the bit line. If the storage capacitor $C_s$ contains a logic 0, $V_C$ is less than the bit line voltage, so current flows from the bit line to the storage capacitor $C_s$. The voltage on the bit line is then sensed to determine whether it increased toward a logic 1 or decreased toward a logic zero in order to read the value stored on the capacitor. To write to the DRAM cell 100, the bit line 106 is used to charge the storage capacitor $C_s$ to the desired value.

Figure 1B:
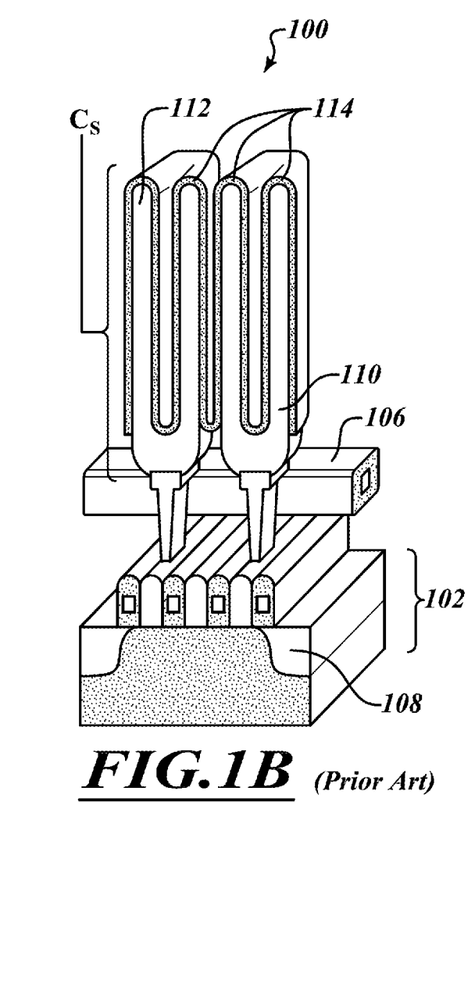
FIG. 1B is a cross-sectional view of a conventional DRAM cell shown in FIG. 1A, according to the prior art.

FIG. 1B shows a cross section of the DRAM cell 100, in which the storage capacitor $C_s$ is fabricated on a silicon substrate, on top of the transistor 102. Parts of the storage capacitor $C_s$, including the bottom electrode 110, top electrode 112, and dielectric 114, are clearly shown. In a DRAM, higher capacitance allows for greater storage capacity. High capacitance, $C=\kappa\epsilon A/d$, corresponds to capacitor plates having a large surface area, A, and a small spacing, d. On the other hand, transistor switching speed for operating the memory increases as the dimensions get smaller. So, there is an inherent conflict between the need for higher speed, which is achieved with smaller dimensions, and the need for larger storage capacity, which is achieved with larger size capacitors. One way to compensate for this, according to the prior art, is to have the capacitors extend vertically above the transistor, as shown in FIG. 1B.

Figure 2A:
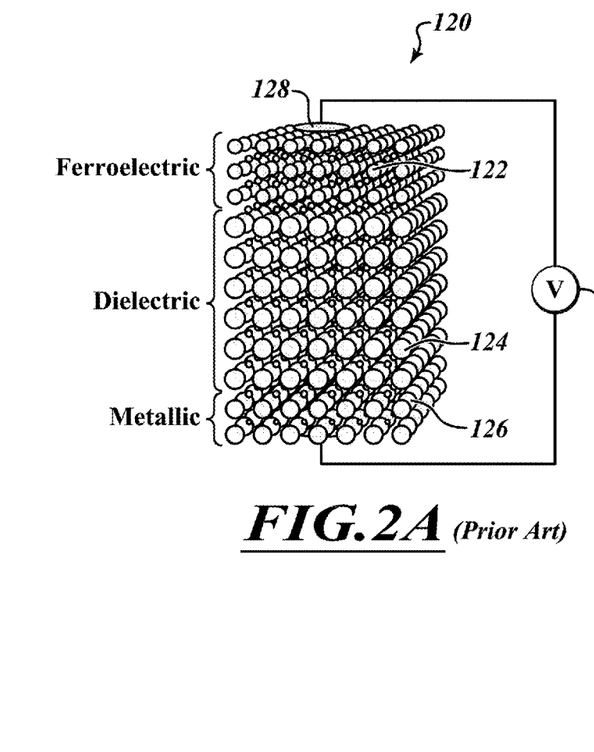
FIG. 2A is a pictorial perspective view of a prior art dielectric/ferroelectric bi-layer.

FIG. 2A shows a molecular model of a ferroelectric capacitor 120 as envisioned by C. S. Hwang of Seoul National University in a presentation entitled "Semiconductor Memory Technology: It Is Time to Shift the Paradigm," presented at the Spring, 2013 meeting of the Materials Research Society, held in San Francisco, Calif. The ferroelectric capacitor 120 includes a ferroelectric layer 122 and a dielectric layer 124, sandwiched between a metallic layer 126, which serves as a lower electrode, and an upper electrode 128. The ferroelectric layer 122 is made of $Pb(Zr_{0.2}Ti_{0.8})O_3$, or "PZT", and the dielectric layer 124 is made of $SrTiO_3$. The ferroelectric layer 122 is shown as three molecules thick, while the metallic layer is shown as two molecules thick. Together the layers 122 and 124 form a ferroelectric bi-layer. A voltmeter 125 is shown coupled across the ferroelectric capacitor 120 to monitor the polarization response.

Figure 2B:
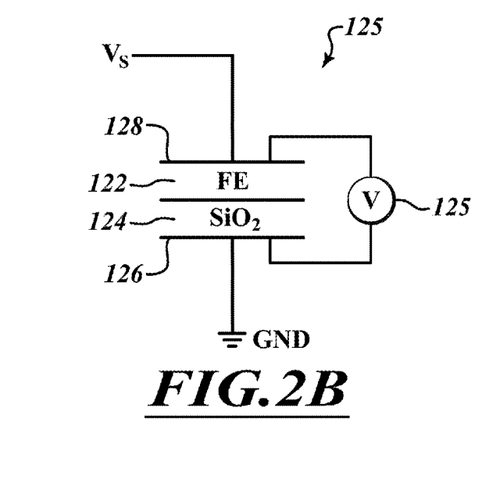
FIG. 2B is a circuit schematic of the dielectric/ferroelectric bi-layer shown in FIG. 2A.
Figure 2C:
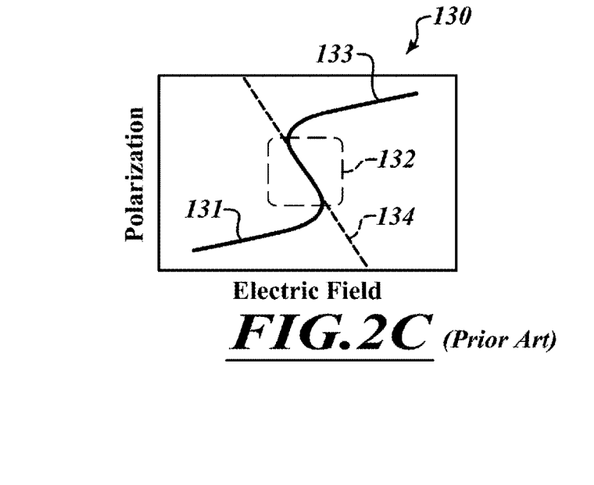
FIG. 2C is a plot of polarization as a function of applied electric field for a prior art ferroelectric capacitor exhibiting negative capacitance.

FIG. 2B shows a circuit schematic 125 that corresponds to the ferroelectric capacitor 120. In the circuit schematic 125, the upper electrode 128 is coupled to a voltage source $V_s$ and the metallic layer 126 is grounded. FIG. 2C shows a polarization curve 130 showing the electric polarization of the ferroelectric capacitor 120 in response to application of a voltage. The polarization curve 130 is part of a hysteresis curve that resembles a conventional ferromagnetic hysteresis curve in certain respects. As the electric field associated with the applied voltage increases, the electric polarization increases monotonically. At 131 and 133, the slope of the polarization curve is positive, similar to a conventional ferromagnetic hysteresis curve. Unlike a conventional ferromagnetic hysteresis curve, however, a portion of the polarization curve 130 shown within the dashed box 132 exhibits a negative slope 134 that corresponds to a negative capacitance. In accordance with the theory set forth by Salahuddin, the polarization curve 130 predicts that when such a ferroelectric capacitor 120 having negative capacitance is placed in series with a conventional capacitor, the capacitance of the series combination will be very large, despite the dimensions of the device being very small. By producing such a large capacitance, the series combination overcomes the scaling limitations that have traditionally posed a challenge to DRAM cell development.

Figure 3A:
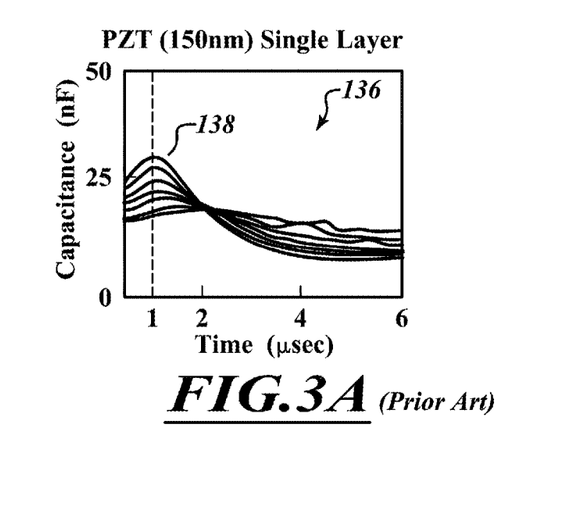
FIG. 3A is a plot of capacitance for a single layer prior art PZT ferroelectric capacitor, in response to an applied current pulse.
Figure 3B:
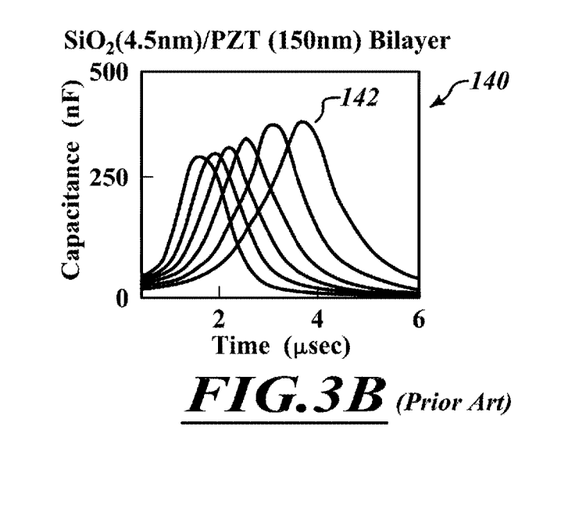
FIG. 3B is a plot of capacitance for a prior art series combination of a ferroelectric capacitor and a dielectric capacitor, in response to an applied current pulse.
Figure 3C:
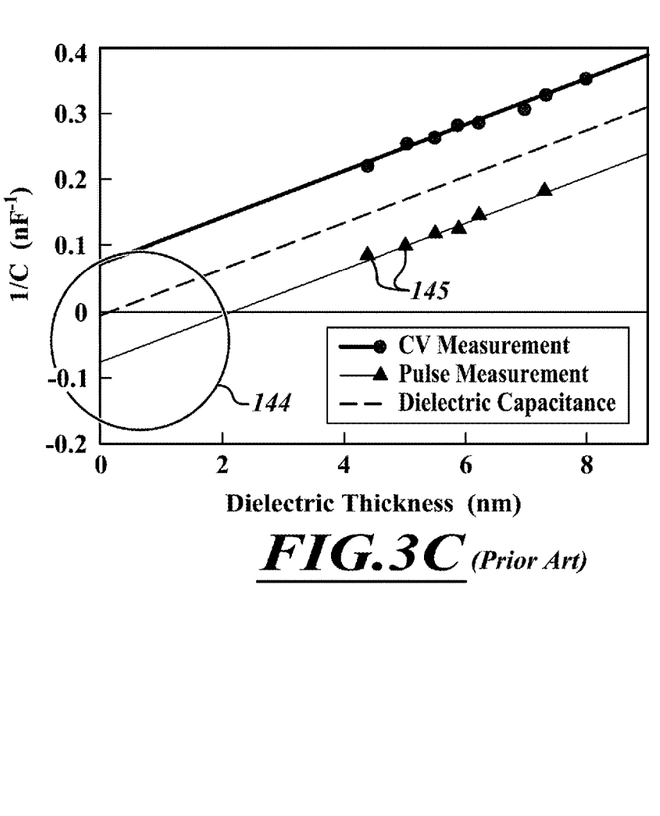
FIG. 3C is a family of plots of inverse capacitance as a function of dielectric thickness showing positive capacitance for a prior art dielectric capacitor and negative capacitance for a prior art ferroelectric capacitor.

FIGS. 3A, 3B, 3C, and 4 are excerpted from Hwang. FIGS. 3A-3C show experimental data confirming that the theoretically predicted capacitance behavior is observed for the bi-layer ferroelectric capacitor 120. FIG. 3A shows a first series of plots 136 of capacitance as a function of time for a single layer of ferroelectric material, e.g., the layer 122 alone, for comparison with the bi-layer capacitor. The FE in this example is a 150-nm thick layer of PZT. The maximum capacitance 138 of the FE layer alone in response to a series of applied charging current pulses is about 30 nF.

FIG. 3B shows a second series of plots 140 of capacitance as function of time for a ferroelectric bi-layer, e.g., layers 122 and 124 together, for comparison with the first series of plots 136 shown in FIG. 3A. The ferroelectric bi-layer in this example includes the 150-nm thick ferroelectric layer made of PZT, and a 4.5-nm thick dielectric layer made of $SiO_2$. It is observed that, in response to a series of applied charging current pulses, the ferroelectric bi-layer exhibits a transient capacitance spike 142 to about 375 nF, ten times greater than the transient response shown in FIG. 3A that is observed for a single layer of 150-nm thick PZT without the $SiO_2$ layer. The capacitance spike 142 thus confirms the behavior predicted by the polarization curve and Equation (3). While the capacitance spike is not infinite, it satisfies the prediction because the capacitance spike 142 is so large.

FIG. 3C shows a plot of bi-layer capacitance as a function of the thickness of the $SiO_2$ dielectric layer. For dielectric layer thicknesses less than 2.0 nm, the transient capacitance observed in response to an applied current pulse is negative. For thicknesses greater than 2.0 nm, e.g., the case shown in FIG. 3B, the capacitance observed in response to an applied current pulse is positive. Thus, the negative capacitance values shown within the circle 144 along the line corresponding to pulsed measurements 145 is limited to a range of dielectric thicknesses, as well as being a transient effect, i.e., limited to within a short time interval.

Figure 4:
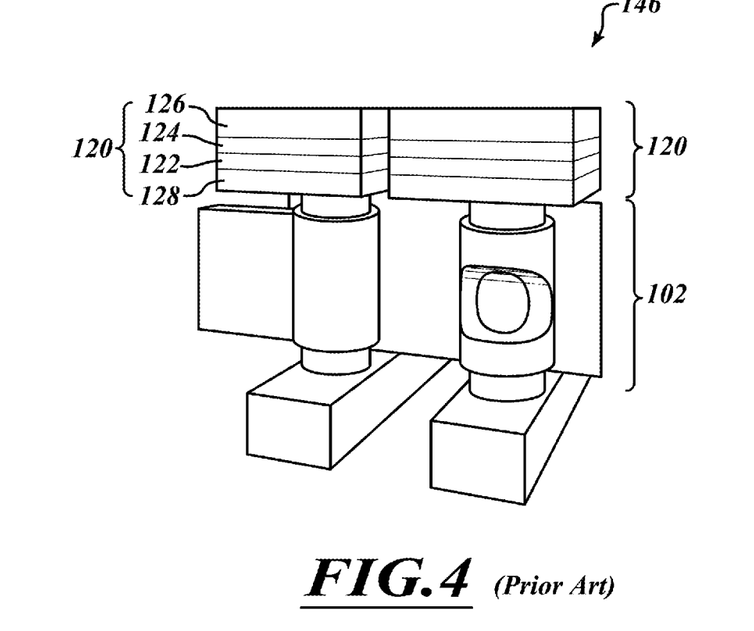
FIG. 4 is a pictorial view of a pair of ferroelectric DRAM cells according to the prior art.

FIG. 4 shows a cross-sectional view of an inventive ferroelectric DRAM cell 146 in which the conventional dielectric storage capacitor $C_s$ has been replaced with a pair of bi-layer ferroelectric capacitors 120 on top of vertical transistors 102. Within the ferroelectric capacitor 120 are shown the ferroelectric layer 122, the dielectric layer 124, and electrodes 126, 128. The ferroelectric capacitor on the right-hand side is shown overlying a vertical transistor 102 in which a section is cut away, revealing interior layers of the transistor.

Figure 5:
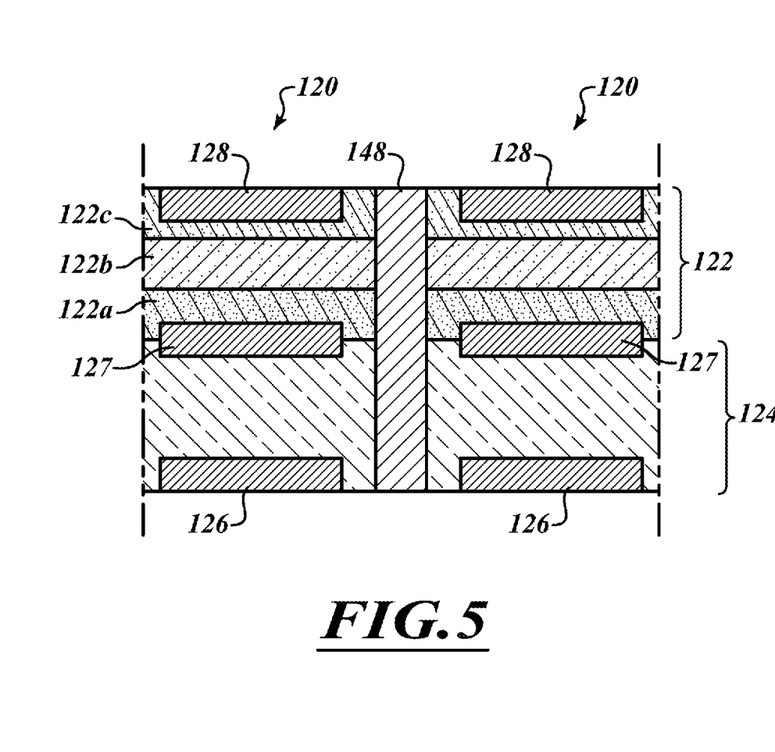
FIG. 5 is a cross-sectional view of a pair of capacitive structures for use in integrated circuit ferroelectric DRAM cells, according to one embodiment described herein.

DRAM structures that show details of the vertical transistor 102 are disclosed in U.S. Pat. Nos. 7,824,982 and 6,734,484. Portions of the ferroelectric capacitor 120 of the ferroelectric DRAM cell 146 are shown in FIG. 5 as an inventive integrated structure formed on a semiconductor substrate. FIGS. 6-10 below then describe the process of forming an integrated array of such DRAM cells 146.

With reference to FIG. 5, completed ferroelectric capacitor portions of the ferroelectric DRAM cell 146 are shown, including the ferroelectric layer 122, the dielectric layer 124, and lower, middle, and upper electrodes 126, 127, and 128, respectively. The lower and middle electrodes, 126 and 127, provide circuit designers with electrical access to positive capacitors $C_p$ between adjacent metal lines. Series combinations of such positive capacitors yield very small overall capacitances. Meanwhile, the lower and upper electrodes, 126 and 128, provide electrical access to the very large overall capacitance of the FE/dielectric series combination. A deep filled trench 148 provides lateral separation between the two capacitors 120.

Figure 6:
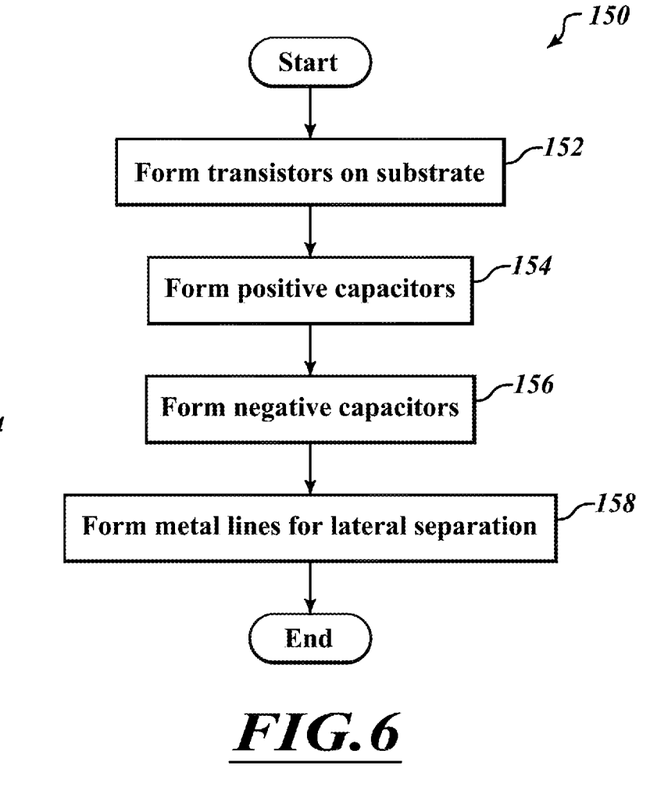
FIG. 6 is a flow diagram showing generalized steps in a method of fabricating an array of ferroelectric capacitive cells, as described herein.

With reference to FIGS. 6-10, fabrication of one embodiment of an array of ferroelectric DRAM cells 146 according to an exemplary method 150 is shown and described. FIG. 6 shows a high level sequence of steps in the exemplary method 150. FIGS. 7-10 illustrate formation of the ferroelectric capacitor portions of the ferroelectric DRAM cells 146, step-by-step, following the exemplary method 150. In this embodiment, positive and negative capacitors $C_p$ and $C_n$ are incorporated into an interconnect structure so as to influence operating characteristics of the interconnect structure, for example, RC delays and the like.

At 152, vertical transistors 102 are formed on a semiconductor substrate according to methods that are well known in the art, for example, as described in U.S. Pat. Nos. 7,824,982 and 6,734,484.

At 154, an array of positive capacitors $C_p$ is formed on the substrate, including bottom electrodes 126, the dielectric layer 124, and middle electrodes 127.

At 156, an array of negative capacitors $C_n$ is formed on the substrate, including the ferroelectric layer 122 and upper electrodes 128. In the embodiment shown and described, the ferroelectric layer 122 is a ferroelectric film stack that includes three sub-layers, 122a, 122b, and 122c, each sub-layer made of a different ferroelectric material.

At 158, the deep filled trenches 148 are formed as separators between adjacent pairs of capacitors.

Figure 7:
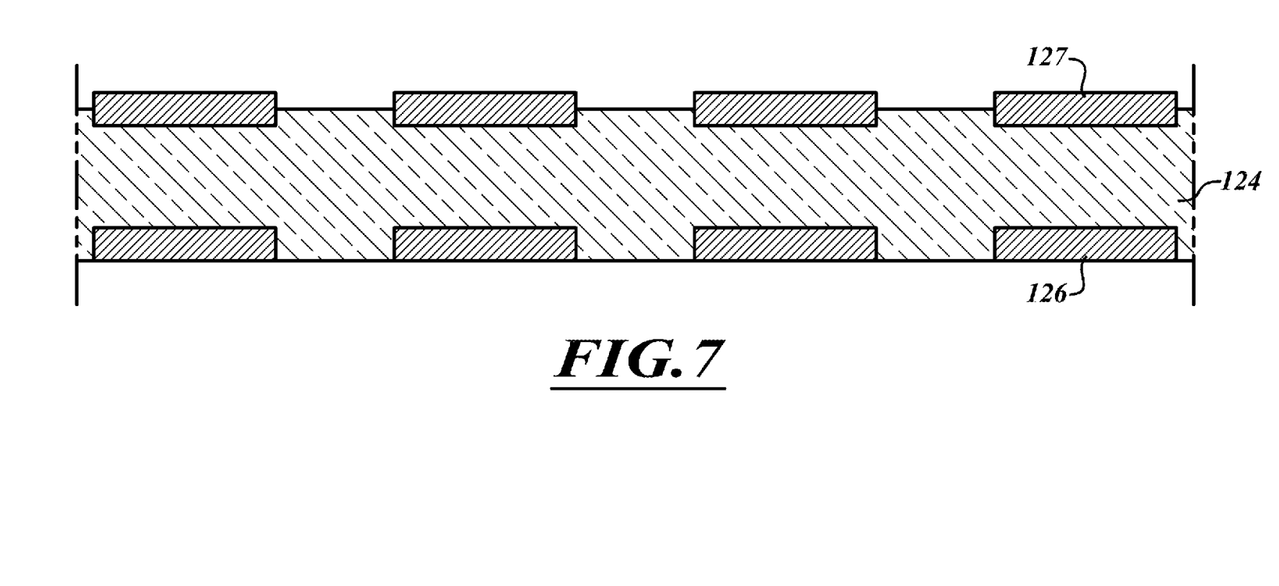
FIG. 7 is a cross-sectional view of a positive capacitor array, according to one embodiment described herein.

FIG. 7 shows the formation of a positive capacitor $C_p$ at 154, according to one embodiment. The positive capacitor $C_p$ includes the bottom electrodes 126, the middle electrodes 127, and the dielectric layer 124. First, a thin layer of dielectric material is formed on the substrate using a standard deposition process such as CVD, PVD, or the like. The thin dielectric layer is preferably about 10 nm thick but could be up to about 60 nm thick. The thin dielectric layer is made of silicon dioxide ($SiO_2$), for example, or any ultra-low-k dielectric material having a dielectric constant within the range of about 1.5-3.0.

Following deposition, an array of bottom electrodes 126 is formed in the thin layer of dielectric material using a damascene process. The thin layer of dielectric material is patterned using a photoresist mask or a hard mask, and openings are etched in a conventional way. The width of the openings is desirably within the range of 1-20 nm. The openings are then filled with an interconnect metal, for example, a metal liner made of titanium (Ti), or titanium nitride (TiN), or tantalum nitride (TaN) followed by a bulk metal such as tungsten (W), copper (Cu), or aluminum (Al). If the bulk metal is copper, then the metal liner used may be TaN, for example. If the bulk metal is not copper, the metal liner used may be Ti or TiN, as other examples. The interconnect metal is then polished back to the level of the dielectric layer using a CMP process, thereby creating a structure having a substantially planar surface.

A thick layer of dielectric material is then deposited over the array of bottom electrodes. The thickness of the thick dielectric layer is desirably within the range of about 20-40 nm. The dielectric layer 124 includes the thick layer and the original thin layer of dielectric material. The two layers within the dielectric layer 124 are desirably made of the same material. However, this is not required. For example, the thin layer may be made of a silicon dioxide material while the thick layer is made of silicon nitride.

An array of middle electrodes 127 is then formed in the dielectric layer 124, again using a damascene process similar to that used to form the array of bottom electrodes described above. The array of middle electrodes 127 is similar to the array of bottom electrodes 126, again presenting a substantially planar surface to the next layer that will be formed on top of the inlaid middle electrodes.

Figure 8:
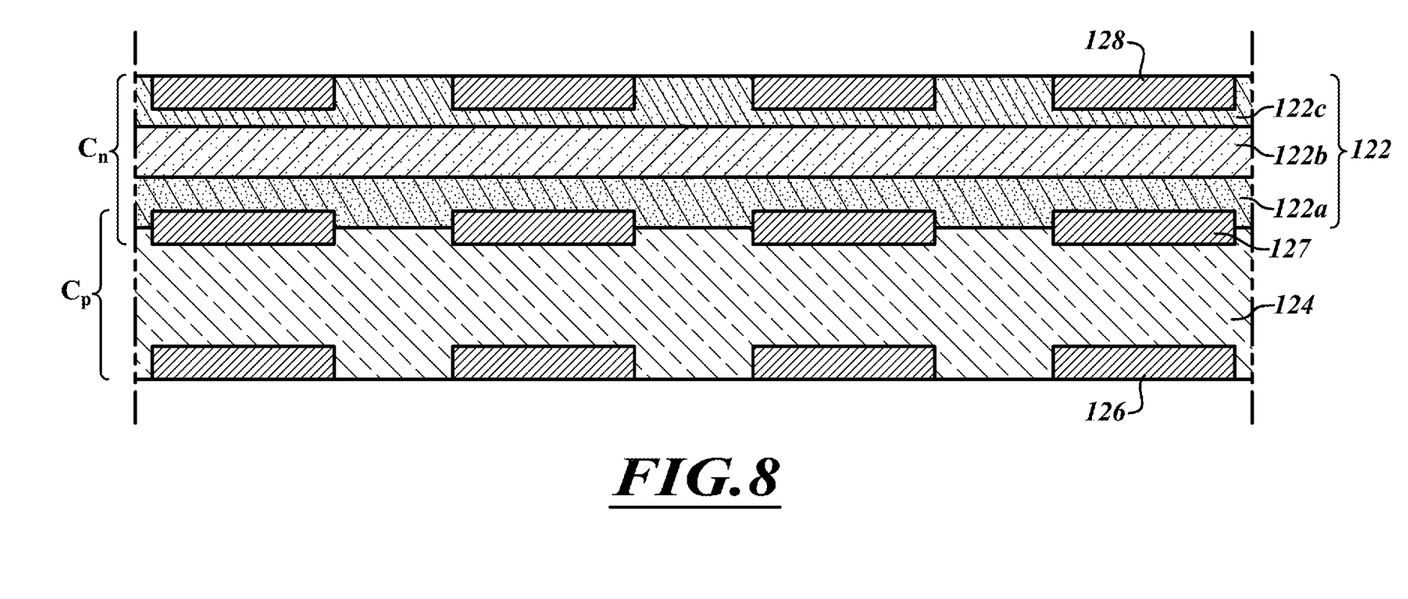
FIG. 8 is a cross-sectional view of a negative capacitor array, according to one embodiment described herein.

FIG. 8 shows the formation of the negative capacitor $C_n$ at 156, according to one embodiment. The negative capacitor $C_n$ includes the upper electrodes 128 and the ferroelectric film stack sub-layers 122a, 122b, and 122c, and shares the middle electrodes 127 with the positive capacitor $C_p$. First, a first layer of ferroelectric material 122a is formed on the substrate. In one embodiment, the first layer of ferroelectric material 122a is 1-20 nm of strontium ruthanate, also known as SRO ($SrRuO_3$). Next, a second layer of ferroelectric material 122b is formed on the substrate. In one embodiment, the second layer of ferroelectric material 122b is 1-20 nm of strontium titanate ($SrTiO_3$). Next, a third layer of ferroelectric material 122c is formed on the substrate. In one embodiment, the third layer of ferroelectric material 122c is 1-20 nm of lead zirconate titanate, also known as PZT ($(Pb(Zr_{0.2}Ti_{0.3})O_3)$). Alternatively, the third layer of ferroelectric material 122c can include $BaTiO_3$ or $PbTiO_3$. Deposition methods for ferroelectric materials are currently under development and many are available in the market today. More will be developed in the future. Any such methods that are appropriate and effective can be used to deposit any of the ferroelectric materials described herein, for the purposes of forming the ferroelectric layer 122. Such methods include, but are not limited to, CVD, PVD, sputtering deposition, electrophoretic deposition (EPD), and chemical solution deposition (CSD). An embodiment may also include barrier layers at least partially surrounding the ferroelectric materials, and/or intervening between a given ferroelectric material and another material, to prevent shorts forming through adjacent dielectric materials, and to sufficiently contain the ferroelectric materials.

An array of upper electrodes 128 is formed in the third layer of ferroelectric material 122c, again using a damascene process similar to that used to form the arrays of bottom and middle electrodes 126 and 127, respectively, as described above. The size and materials of the array of upper electrodes 128 are similar to those of the arrays of bottom and middle electrodes 126.

Figure 9:
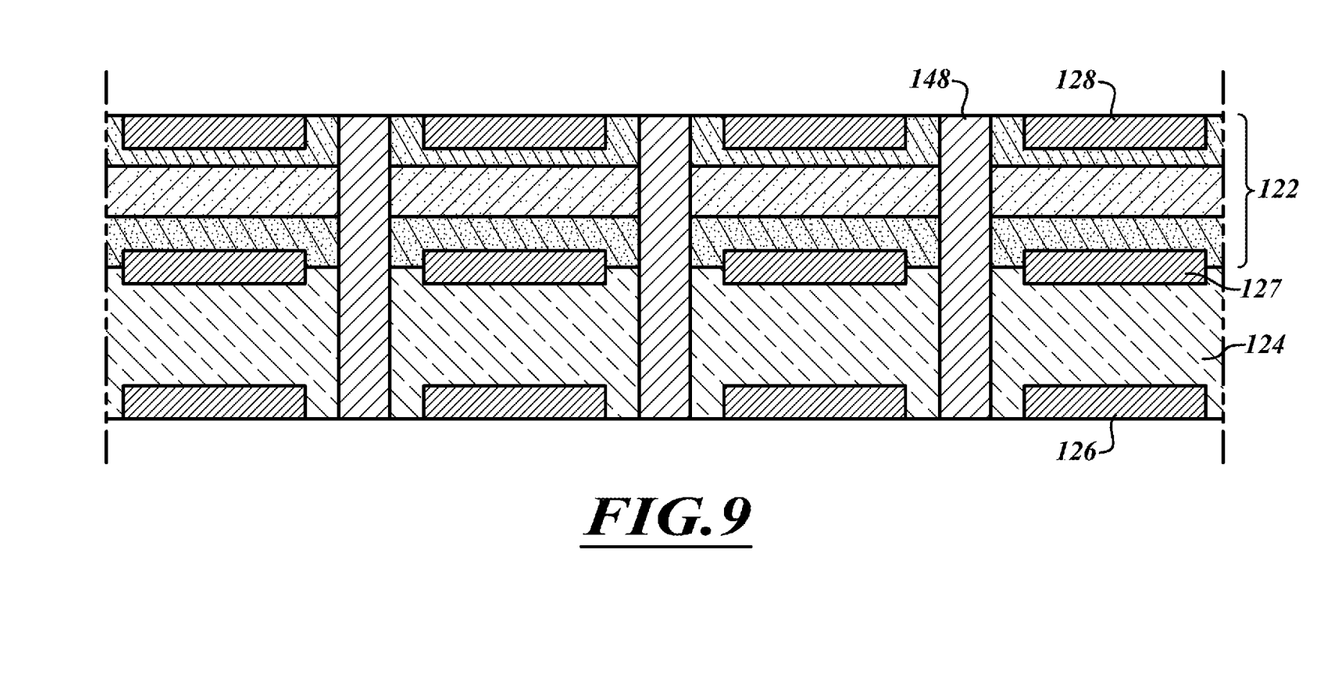
FIG. 9 is a cross-sectional view of a completed array of ferroelectric capacitive cells, according to a first embodiment described herein.

FIG. 9 shows the formation, at 158, of the array of the deep filled trenches 148, according to one embodiment. Deep trenches are etched through all of the layers, down to the substrate, using, for example, a high power anisotropic etch process which is well known in the art as being suitable for etching vias. The dimensions of the trenches will determine, in part, the inter-trench capacitance and trench resistance. The trenches are then filled, first with two conformal liners, and then with bulk metal. The first trench liner is an insulator such as, for example, silicon carbide (SiC). The second trench liner and the bulk metal are the standard metal liner and bulk metals which are also used in forming the metal electrodes 126, 127, and 128. The trench fill materials are then polished back to be coplanar with the third layer of ferroelectric material 122c.

Figure 10:
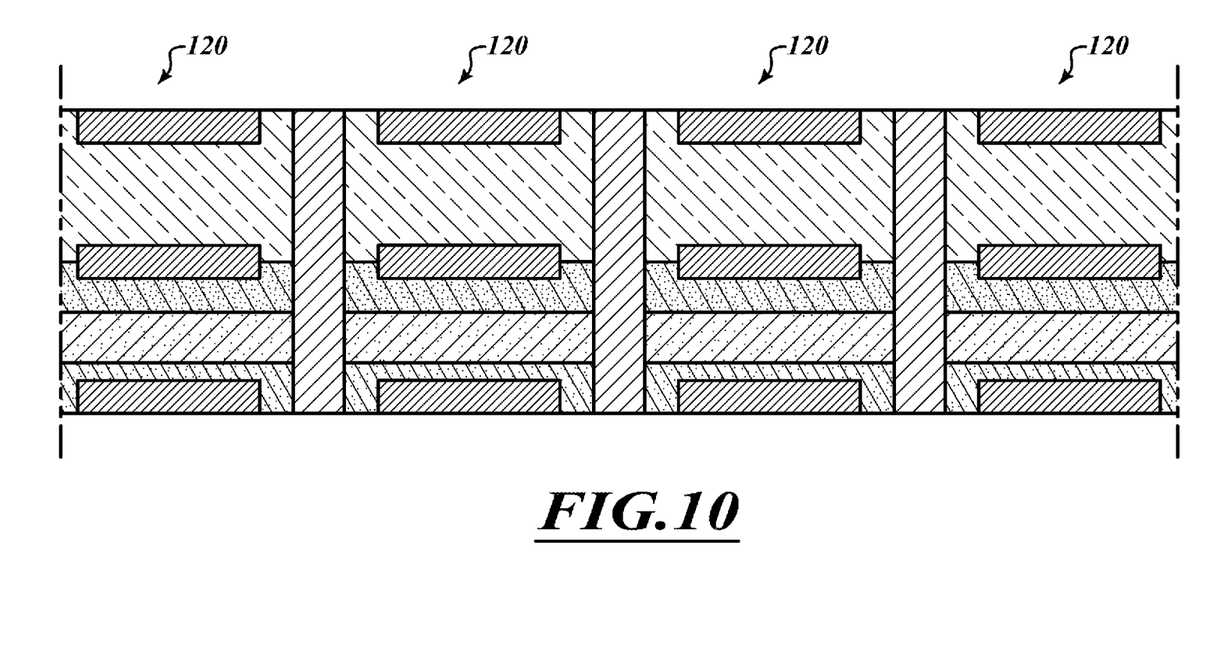
FIG. 10 is a cross-sectional view of a completed array of ferroelectric capacitive cells, according to a second embodiment described herein.

FIG. 10 shows a second, alternative embodiment of the completed array of capacitors, in which the ferroelectric layer 122 is formed first, and the dielectric layer 124 is formed on top of the ferroelectric layer 122.

Figure 11:
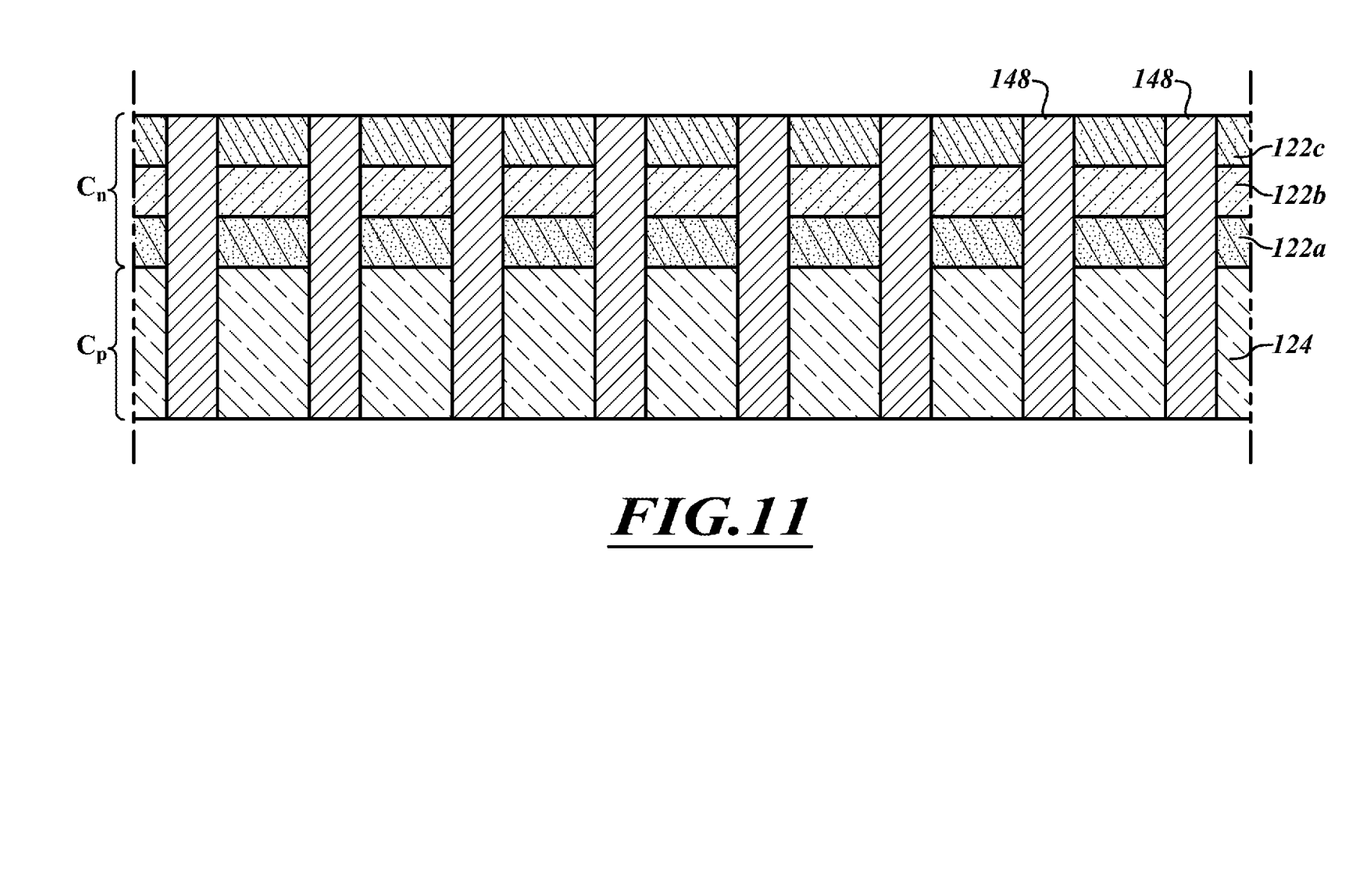
FIG. 11 is a cross-sectional view of a completed array of ferroelectric capacitive cells, according to a third embodiment described herein.

FIG. 11 shows a third, alternative embodiment of the completed array of capacitors, which excludes the metal electrodes 126, 127, and 128. The array shown in FIG. 11 serves as a high density, high performance metal interconnect structure, with negligible RC delays. Structural compensation for the lack of electrodes can be made by using a ULK dielectric 124 that has a high dielectric constant, about 4.0. Such a ULK dielectric 124 provides enhanced structural stability during formation of the array, especially prior to completion of the deep filled trenches 148. Total capacitance between adjacent metal lines (i.e., the deep filled trenches 148) used as interconnects can be tuned to approximately zero by designing $C_n$ and $C_p$ to have substantially equal capacitance values, $C_n = -C_p$, so they cancel out one another.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of making a microelectronic structure, the method comprising:
    forming transistors on a semiconductor substrate;
    depositing, through one of chemical vapor deposition and plasma vapor deposition, a thin dielectric layer;
    forming, in a planar surface and after depositing the dielectric layer, a first set of electrodes through a damascene process and overlying the transistors, the dielectric layer being in contact with the first set of electrodes and having a thickness between 10 nm and 60 nm in a direction orthogonal to the planar surface;
    forming a second set of electrodes in contact with the dielectric layer;
    depositing a ferroelectric layer in contact with the second set of electrodes; and
    forming a third set of electrodes in contact with the ferroelectric layer.

2. The method of claim 1, further comprising depositing the dielectric layer in contact with the ferroelectric layer to form a capacitive bi-layer.

3. The method of claim 1 wherein the ferroelectric layer includes $Pb(Zr_xTi_y)O_3$.

4. The method of claim 1 wherein forming the first set of electrodes, depositing the dielectric layer, and forming the second set of electrodes comprises forming an array of positive capacitors, each positive capacitor in the array being formed by a corresponding electrode in the first set of electrodes, a corresponding electrode in the second set of electrodes, and a portion of the dielectric layer between these corresponding electrodes in the first and second sets of electrodes.

5. The method of claim 4 wherein forming the second set of electrodes, depositing the ferroelectric layer, and forming the third set of electrodes comprise forming an array of negative capacitors, each negative capacitor electrically coupled in series with a corresponding positive capacitor in the array of positive capacitors and each negative capacitor in the array being formed by a corresponding electrode in the second set of electrodes, a corresponding electrode in the third set of electrodes, and a portion of the ferroelectric layer between these corresponding electrodes in the second and third sets of electrodes.

6. The method of claim 1 wherein the damascene process comprises:
    patterning the thin dielectric layer with a mask;
    etching the patterned thin dielectric layer to form openings in the thin dielectric layer;
    filling the openings with an interconnect metal material;
    planarizing the interconnect metal material to level of a surface of the thin dielectric layer to form the first set of electrodes; and
    depositing a thick dielectric layer over the thin dielectric layer and first set of electrodes.

7. The method of claim 6 wherein the thin dielectric layer and the thick dielectric layer comprise a same dielectric material.

8. The method of claim 1 wherein depositing the ferroelectric layer comprises forming a ferroelectric film stack comprising a plurality of ferroelectric sub-layers.

9. The method of claim 1 wherein forming the second set of electrodes comprises forming the second set of electrodes through a damascene process.

10. A method, comprising:
    forming a thin dielectric layer on a substrate;
    forming openings in the thin dielectric layer;
    forming an array of lower electrodes in the thin dielectric layer by filling the openings in the thin dielectric layer with a conductive material;
    planarizing the thin dielectric layer and the array of lower electrodes;
    forming a thick dielectric layer over the thin dielectric layer and the array of lower electrodes;
    forming openings in the thick dielectric layer;
    forming an array of middle electrodes in the thick dielectric layer by filling the openings in the thick dielectric layer with a conductive material;
    forming a ferroelectric layer over the thick dielectric layer and the array of middle electrodes, the ferroelectric layer having an upper surface opposite the array of middle electrodes;
    forming openings in the upper surface of the ferroelectric layer by patterning the upper surface of the ferroelectric layer;
    forming an array of upper electrodes in the upper surface of the ferroelectric layer by filling the openings in the upper surface of the ferroelectric layer with a conductive material; and
    forming a transistor on the substrate, wherein the thin dielectric layer is formed over the transistor.

11. The method of claim 10 wherein the thin dielectric layer and the thick dielectric layer are formed from a same material.

12. The method of claim 10 wherein the ferroelectric layer comprises a plurality of ferroelectric sub-layers.

13. The method of claim 10 further comprising forming a plurality of deep filled trenches extending from the upper surface of the ferroelectric layer to a lower surface of the thin dielectric layer, each of the plurality of deep filled trenches extending vertically and positioned between adjacent lower electrodes of the array of lower electrodes, between adjacent middle electrodes of the array of middle electrodes, and between upper electrodes of the array of upper electrodes.

14. A method, comprising:
  forming an array of lower electrodes on a substrate;
  forming a thin dielectric layer on the array of lower electrodes, the thin dielectric layer having an upper surface;
  forming a thick dielectric layer on the upper surface of the thin dielectric layer, the thick dielectric layer having an upper surface opposite the upper surface of the thin dielectric layer;
  forming in the upper surface of the thick dielectric layer an array of middle electrodes;
  forming a ferroelectric layer on the upper surface of the thick dielectric layer and the array of middle electrodes, the ferroelectric layer having an upper surface opposite the upper surface of the thick dielectric layer;
  forming an array of upper electrodes in the upper surface of the ferroelectric layer; and
  forming a transistor on the substrate, before forming the array of lower electrodes.

15. The method of claim 14 wherein forming each of the array of lower electrodes, the array of middle electrodes, and the array of upper electrodes comprises damascene process.

16. The method of claim 14, further comprising:
  forming deep trenches each extending from the upper surface of the ferroelectric layer to a surface coplanar with the lower surfaces of the lower electrodes of the array of lower electrodes; and
  filling the deep trenches with a metal material.

\* \* \* \* \*

UNITED STATES PATENT AND TRADEMARK OFFICE
CERTIFICATE OF CORRECTION

| | | |
|---|---|---|
| PATENT NO. | : 11,063,112 B2 | Page 1 of 1 |
| APPLICATION NO. | : 16/164481 | |
| DATED | : July 13, 2021 | |
| INVENTOR(S) | : John H. Zhang | |

It is certified that error appears in the above-identified patent and that said Letters Patent is hereby corrected as shown below:

In the Claims

Column 12, Line 11, Claim 15:
"comprises damascene" should read, --comprises a damascene--.

Signed and Sealed this
Twenty-first Day of February, 2023

Katherine Kelly Vidal
*Director of the United States Patent and Trademark Office*